(12) United States Patent
Tanaka

(10) Patent No.: US 7,239,211 B2
(45) Date of Patent: Jul. 3, 2007

(54) TEMPERATURE-COMPENSATED CRYSTAL OSCILLATOR

(75) Inventor: Yoshikatsu Tanaka, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/783,823

(22) Filed: Feb. 20, 2004

(65) Prior Publication Data

US 2004/0164813 A1   Aug. 26, 2004

(30) Foreign Application Priority Data

Feb. 21, 2003   (JP) ............................. 2003-044597

(51) Int. Cl.
*H03L 1/00* (2006.01)
(52) U.S. Cl. .................. 331/176; 331/66; 331/158; 331/108 C; 331/116 R
(58) Field of Classification Search ............. 331/176, 331/66, 68, 158, 116 R, 175, 108 C, 177 V
See application file for complete search history.

(56) References Cited

U.S. PATENT DOCUMENTS

| | | | | |
|---|---|---|---|---|
| 4,627,533 A | * | 12/1986 | Pollard | ............... 331/177 R |
| 6,487,085 B1 | * | 11/2002 | Kimura et al. | ............... 361/763 |
| 6,664,864 B2 | * | 12/2003 | Jiles et al. | ................. 331/176 |
| 6,847,265 B2 | * | 1/2005 | Tanaka et al. | ........... 331/108 D |
| 6,998,925 B2 | * | 2/2006 | Harima et al. | ................ 331/68 |

FOREIGN PATENT DOCUMENTS

| | | |
|---|---|---|
| JP | 61-81208 | 5/1986 |
| JP | 06-085538 | 3/1994 |

* cited by examiner

*Primary Examiner*—Arnold Kinkead
(74) *Attorney, Agent, or Firm*—Katten Muchin Rosenman LLP

(57) ABSTRACT

A temperature-compensated quartz crystal oscillator includes a substrate having a circuit pattern disposed on a surface thereof and mounting electrodes disposed on a reverse side thereof and electrically connected to the circuit pattern, circuit components mounted on the surface of the substrate and electrically connected to the circuit pattern, and a surface-mounted quartz crystal unit having a hermetically sealed quartz crystal blank, and mounted on the surface of the substrate and electrically connected to the circuit pattern. The crystal unit has a cavity defined in a mounting surface thereof, at least one of the circuit components being housed in the cavity.

7 Claims, 3 Drawing Sheets

TEMPERATURE-COMPENSATED CRYSTAL OSCILLATOR

BACKGROUND OF THE INVENTION

1. Field of the Invention

The present invention relates to a temperature-compensated quartz crystal oscillator, and more particularly to a temperature-compensated crystal oscillator (TCXO) which employs a component layout that is designed for a highly reduced size.

2. Description of the Related Art

Quartz crystal units are incorporated as a time or frequency reference source in mobile communication devices such as cellular phones or the like, and temperature-compensated crystal oscillators are adopted to compensate for temperature-depending changes in the resonant frequency of such crystal units.

In recent years, there has been a growing demand for smaller temperature-compensated crystal oscillators in view of a quick tendency toward smaller mobile communication devices such as cellular phones or the like. Temperature-compensated crystal oscillators generally comprise a substrate, and a crystal unit and an oscillating circuit which are disposed on one surface of the substrate. A temperature-compensated crystal oscillator having a size of approximately 5 mm×7 mm has a mounting surface, i.e., the surface area of a wiring board for mounting crystal oscillator components thereon, large enough to place circuit components of the oscillating circuit and the crystal unit on one substrate even if they are arranged in a plane.

FIG. 1 shows by way of example a temperature-compensated crystal oscillator of the direct compensation type. The temperature-compensated crystal oscillator has IC (Integrated Circuit) 1 and crystal unit 6 connected to IC 1. IC 1 comprises an integrated assembly of two cascaded transistors, some resistors, and capacitors (not shown) which cooperate with crystal unit 6 in making up a Colpitts crystal oscillating circuit. IC 1 has power supply terminal Vcc for supplying electric power to various circuit components inside IC 1, oscillation input terminal X connected to one terminal of crystal unit 6, and output terminal Out for supplying an oscillation output to an external circuit. Crystal unit 6 may comprise an AT-cut quartz crystal unit, for example.

The oscillator also has two frequency-adjusting capacitors 7, 8, temperature-compensating circuit 9, variable capacitance diode 10, resistor 11 for applying a control voltage to the cathode of variable capacitance diode 10, and voltage-dividing resistor 12 connected parallel to variable capacitance diode 10. Capacitors 7, 8 are connected parallel to each other and have ends connected to a junction that is connected to the other terminal of crystal unit 6. The other ends of capacitors 7, 8 are connected to a terminal of temperature-compensating circuit 9, whose other terminal is connected to the cathode of variable capacitance diode 10. Variable capacitance diode 10 has an anode connected to ground.

Temperature-compensating circuit 9 comprises capacitor 13, high-temperature-compensating thermistor 14 connected parallel to capacitor 13, and a series-connected circuit of low-temperature-compensating thermistor 15 and capacitor 16 which are connected parallel to capacitor 13.

The oscillator has four electrodes, for example, for connection to external circuits. The four electrodes include ground electrode 2, power supply electrode 3 which is supplied with a power supply voltage, output electrode 4 where the oscillation output appears, and control electrode 5 to which control voltage Vc is applied for finely adjusting the oscillation frequency of the oscillator. Ground electrode 2 is connected to ground terminal E of IC 1 and the anode of variable capacitance diode 10. Power supply electrode 3 is connected to power supply terminal Vcc of IC 1. Output electrode 4 is connected to output terminal Out of IC 1. Control electrode 5 applies control voltage Vc through resistor 11 to the cathode of variable capacitance diode 10 for finely adjusting the oscillation frequency.

The temperature-compensated crystal oscillator shown in FIG. 1 is referred to as a temperature-compensated crystal oscillator of the direct compensation type because temperature-compensating circuit 9 is directly connected to the crystal unit. Other circuit arrangements of the temperature-compensated crystal oscillator of the direct compensation type are disclosed in Japanese laid-open utility model publication No. 61-81208 (JP. 61-81208, U) and Japanese laid-open patent publication No. 06-85538 (JP, 6-85538, A). There is also known a temperature-compensated crystal oscillator of the indirect compensation type wherein a variable capacitance diode is connected in series to a crystal unit, an output voltage of a temperature sensor is applied to a resistor circuit network or the like to generate a control voltage that changes depending on the temperature according to a cubic curve, and the generated control voltage is applied to the variable capacitance diode for temperature compensation.

The temperature-compensated crystal oscillator shown in FIG. 1 needs ten circuit components in addition to crystal unit 6. If the size of the mounting surface of the crystal oscillator Is reduced to about one-third, for example, of the present size of 5 mm×7 mm, then the surface area of the substrate is no longer large enough to place the crystal unit and the circuit components of the oscillating circuit thereon in a plane.

SUMMARY OF THE INVENTION

It is an object of the present invention to provide a temperature-compensated crystal oscillator which has components arranged three-dimensionally, and hence has very small outer dimensions, can easily be assembled, and is highly reliable.

The object of the present invention can be achieved by a temperature-compensated crystal oscillator comprising a substrate having a circuit pattern disposed on a surface thereof and mounting electrodes disposed on a reverse side thereof and electrically connected to the circuit pattern, circuit components mounted on the surface of the substrate and electrically connected to the circuit pattern, and a surface-mount crystal unit having a hermetically sealed crystal blank, and mounted on the surface of the substrate and electrically connected to the circuit pattern, the crystal unit having a cavity defined in a mounting surface thereof, at least one of the circuit components being housed in the cavity.

According to the present invention, some parts of the temperature-compensated crystal oscillator are arranged three-dimensionally and hence are packaged in a high density configuration. The temperature-compensated crystal oscillator according to the present invention is very small in size, can easily be assembled, and is high in performance.

DETAILED DESCRIPTION OF THE PREFERRED EMBODIMENT

Figure 1:
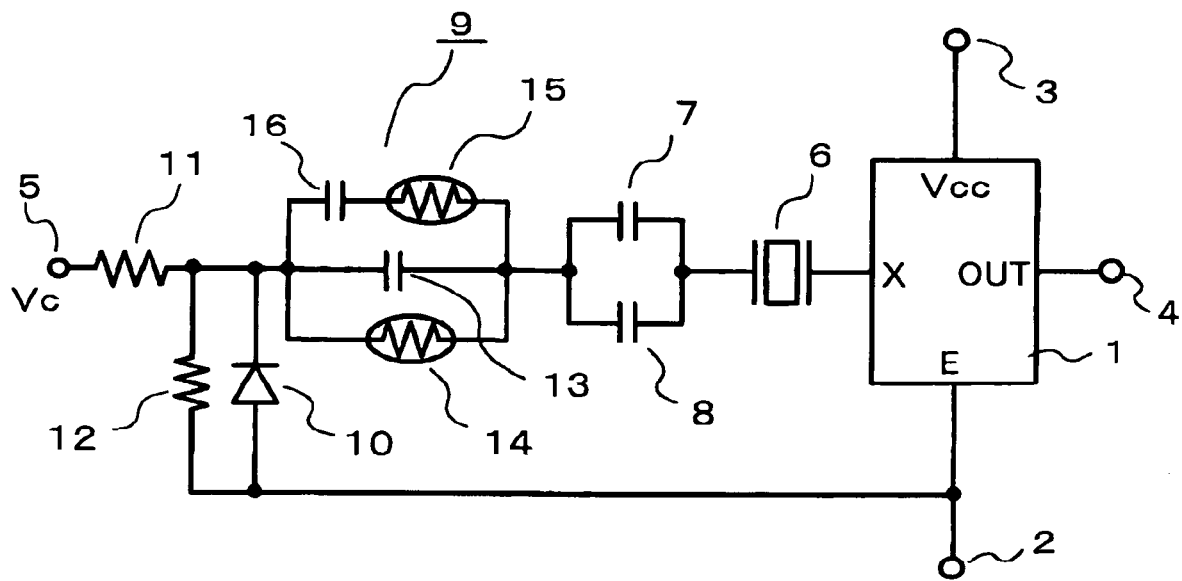
FIG. 1 is a circuit diagram of a temperature-compensated crystal oscillator of the direct compensation type.
Figure 2:
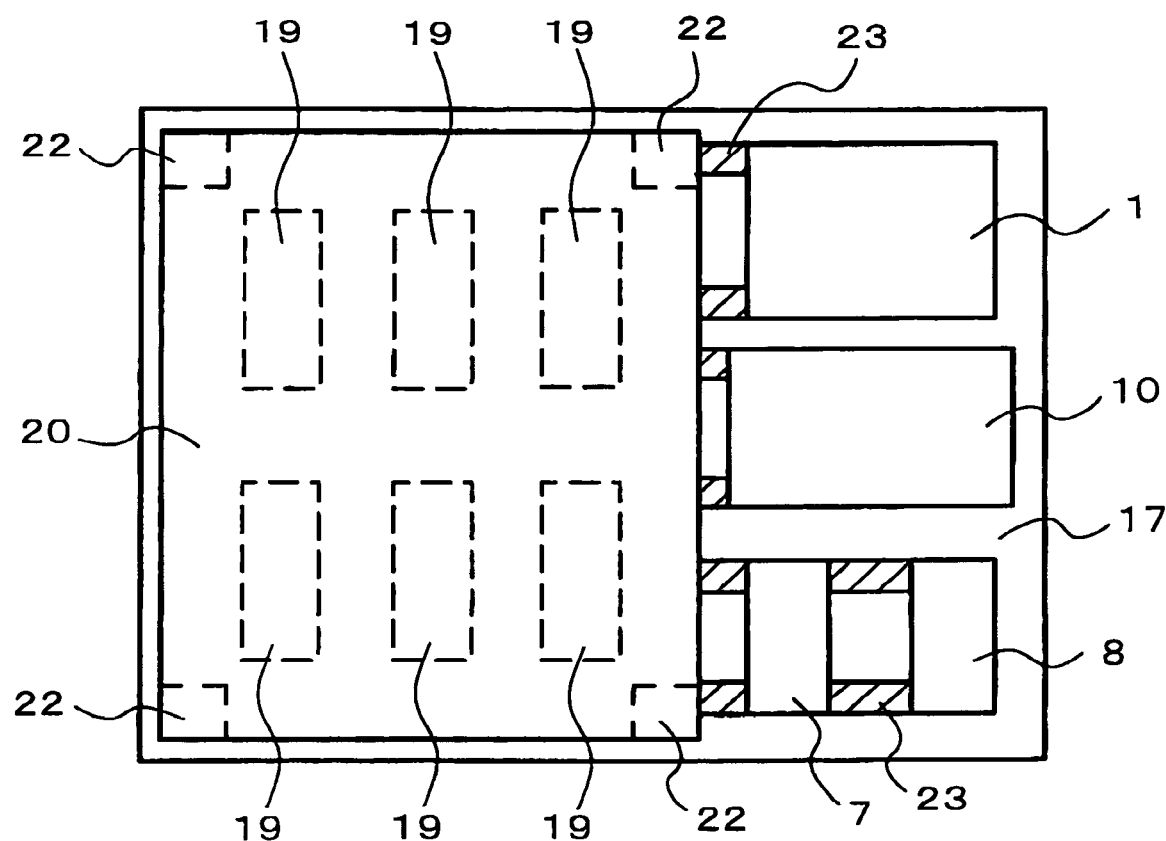
FIG. 2 is a plan view of a temperature-compensated crystal oscillator according to an embodiment of the present invention.
Figure 3:
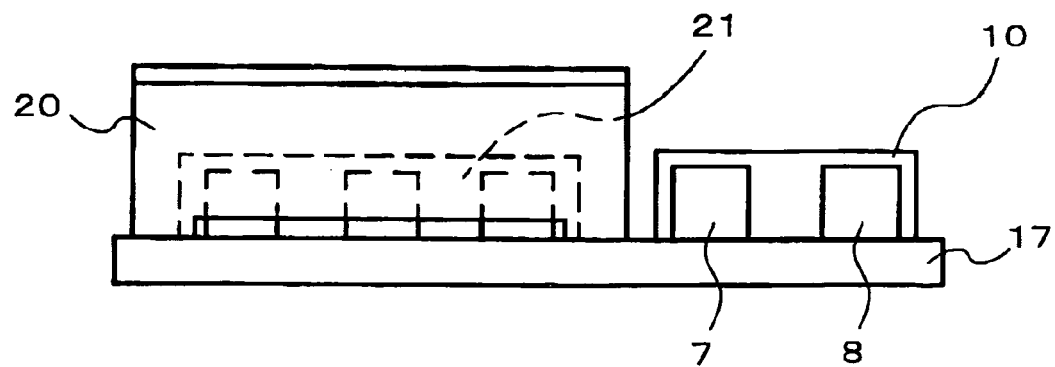
FIG. 3 is a side elevational view of the oscillator shown in FIG. 2.
Figure 4:
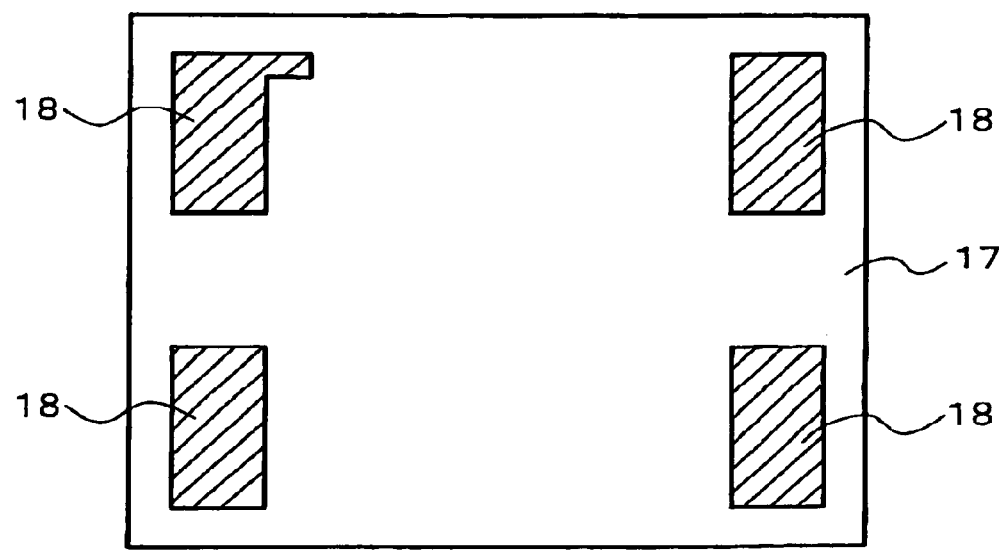
FIG. 4 is a bottom view of the oscillator shown in FIG. 2.

As shown In FIGS. 2 to 4, a temperature-compensated quartz crystal oscillator according to a preferred embodiment of the present invention employs substrate 17 such as an epoxy board, for example, and has circuit components as shown in FIG. 1, i.e., circuit components which cooperate with a quartz crystal unit in making up a temperature-compensated crystal oscillator, disposed on substrate 17.

The temperature-compensated crystal oscillator has a circuit pattern formed on a surface of substrate 17 and four mounting electrodes 18 formed on a reverse side of substrate 17 and electrically connected to the circuit pattern via through holes (not shown). Portions 23 of the circuit pattern are shown hatched In FIG. 2. Mounting electrodes 18 correspond to electrodes 2 to 5 of the circuit shown in FIG. 1.

As shown in FIG. 2, six circuit components 19 are closely disposed on a left side of the surface of substrate 17. Circuit components 19 are chip-type circuit components each having a size of 0.6 mm×0.3 mm, which are smallest circuit elements at present. Circuit components 19 correspond to resistors 11, 12, capacitors 13, 16, and thermistors 14, 15 shown in FIG. 1. Of course, circuit components 19 are electrically connected to the circuit pattern on substrate 17.

Surface-mount crystal unit 20 is mounted on the surface of substrate 17 in superposed and covering relation to six circuit components 19. Crystal unit 20 comprises a quartz crystal blank hermetically sealed In a casing. The casing has cavity 21 defined in the surface thereof which faces substrate 17 for accommodating circuit components 19 therein when crystal unit 20 is mounted on the surface of substrate 17.

Crystal unit 20 has electrodes 22 disposed respectively on the four corners of its mounting surface. The crystal blank has excitation electrodes leading to electrodes 22. Electrodes 22 are electrically connected to the circuit pattern on substrate 17, thus mounting crystal unit 20 on substrate 17.

Substrate 17 has planar dimensions greater than that of crystal unit 20, leaving a region which is not covered with crystal unit 20, i.e., an exposed region. IC 1 and variable capacitance diode 10 of an oscillating circuit are mounted on the exposed region of substrate 17 and electrically connected to the circuit pattern. Generally, IC 1 and variable capacitance diode 10 are greater than circuit components 19, and can be mounted on substrate 17 as they are disposed outside of cavity 21. Two parallel-connected capacitors 7, 8 for determining the oscillation frequency of the crystal oscillator are also mounted on the exposed region of substrate 17 and electrically connected to the circuit pattern. With the oscillating circuit shown in FIG. 1, the oscillation frequency can be slightly changed by changing the capacitances of the capacitors connected in series to the crystal unit. Therefore, it is possible to make adjustments to equalize the oscillation frequency of the crystal oscillator at a predetermined temperature, e.g., 25° C., to the nominal frequency of the crystal oscillator.

Circuit constants of the circuit components (capacitors 13, 16 and thermistors 14, 15) of temperature compensating circuit 9 are selected depending on the frequency vs. temperature characteristics of crystal unit 20 for best temperature compensation characteristics. As a result of the selection of the circuit constants, the oscillation frequency $F_0$ of the crystal oscillator at a predetermined temperature, e.g., 25° C., may deviate from a target frequency for the crystal oscillator. The magnitude of the frequency deviation depends on the combination of the crystal unit and the temperature-compensating circuit, and differs from assembled oscillator to assembled oscillator. Consequently, temperature-compensated crystal oscillators are required to have capacitors for fine frequency adjustments separate from the temperature-compensating circuit. According to the present embodiment, capacitors 7, 8 serve to make fine frequency adjustments. For facilitating fine frequency adjustments, it is preferable to use capacitor 7 having a constant value, e.g., 68 pF, for all oscillators, and mount such capacitor 7 on substrate 17, and also to select capacitor 8 having a value corresponding the deviation from the target frequency of the oscillator being assembled and mount such capacitor 8 on substrate 17. Capacitor 8 should preferably be disposed in an outer position near an edge of substrate 17 remotely from cavity 21, so that capacitor 8 can easily be replaced on substrate 17. Each of capacitors 7, 8 may comprise a ceramic capacitor, for example. Since ceramic capacitors having both positive and negative temperature coefficients of capacitance are freely available in the market, ceramic capacitors having suitable temperature coefficients of capacitance may be used as capacitors 7, 8 for optimum temperature-compensation characteristics of the temperature-compensated crystal oscillator.

According to the present embodiment, the temperature-compensated crystal oscillator of a highly small size is achieved. If the crystal unit used has a planar size of 2.5 mm×2.0 mm, then the temperature-compensated crystal oscillator may use substrate 17 having a planar size of 3.4 mm×2.7 mm, and may have an overall thickness of 1.2 mm.

According to the present embodiment, the temperature-compensating circuit keeps the oscillation frequency of the temperature-compensated crystal oscillator at a constant level regardless of changes in the ambient temperature. A deviation of the oscillation frequency at a given temperature from the target frequency, which is caused by optimizing the circuit constants of the temperature-compensating circuit, can be eliminated by adjusting the capacitances of adjusting capacitors 7, 8.

The circuit components of the temperature-compensating circuit are housed in the cavity that is defined in the mounting surface of the crystal unit so that these circuit components are sandwiched between the crystal unit and the substrate. Accordingly, a temperature change of the crystal unit can be detected more accurately than if the circuit components were disposed on an exposed surface of the crystal unit or the circuit components were disposed remotely from the crystal unit. The temperature-compensated crystal oscillator according to the present embodiment thus has a more accurate temperature compensating function.

As described above, the temperature-compensated crystal oscillator according to the present embodiment has very small outer dimensions, can easily be assembled, is highly reliable, has excellent temperature compensation characteristics, and can easily be adjusted to a target frequency.

What is claimed is:

1. A temperature-compensated crystal oscillator comprising:
 a substrate having a circuit pattern disposed on a surface thereof and mounting electrodes disposed on a reverse side thereof and electrically connected to said circuit pattern;
 circuit components mounted on the surface of said substrate and electrically connected to said circuit pattern; and
 a surface-mount crystal unit having a crystal unit, and mounted on the surface of said substrate and electrically connected to said circuit pattern, the crystal unit being hermetically sealed in a casing independent of said substrate;
 said crystal unit having a cavity defined in a mounting surface thereof, at least one of said circuit components being housed in said cavity, the remaining circuit components being disposed outside of said cavity, and wherein the casing of the hermetically sealed crystal unit is not directly mounted on the substrate;
 wherein the remaining circuit components disposed outside of said cavity include two capacitors; and wherein the two capacitors are selected to optimize the temperature compensation characteristics of the temperature-compensated crystal oscillator.

2. The temperature-compensated crystal oscillator according to claim 1, further comprising a temperature-compensating circuit, said temperature-compensating circuit comprising circuit components housed in said cavity.

3. The temperature-compensated crystal oscillator according claim 2, wherein said temperature-compensated circuit is directly connected to said crystal unit, whereby the temperature-compensated crystal oscillator serves as a temperature-compensated crystal oscillator of the direct compensation type.

4. The temperature -compensated crystal oscillator according to claim 2, further comprising an adjusting capacitor for equalizing an oscillation frequency at a predetermined temperature to a target frequency, said adjusting capacitor being mounted on the surface of said substrate and disposed outside of said cavity.

5. The temperature-compensated crystal oscillator according to claim 1, wherein said circuit components which are disposed in said cavity comprise chip-type circuit components each having a size of 0.6 mm×0.3 mm.

6. The temperature-compensated crystal oscillator according to claim 2, further comprising a variable capacitance diode for changing an oscillation frequency depending on a control voltage supplied from an external circuit, said variable capacitance diode being mounted on the surface of said substrate and disposed outside of said cavity.

7. The temperature-compensated crystal oscillator according to claim 2, wherein the temperature-compensating circuit is formed as a chip-type circuit component.

* * * * *